United States Patent [19]

Johnson et al.

[11] Patent Number: 5,288,377
[45] Date of Patent: Feb. 22, 1994

[54] PROCESS FOR THE MANUFACTURE OF PRINTED CIRCUITS USING ELECTROPHORETICALLY DEPOSITED ORGANIC RESISTS

[75] Inventors: James A. Johnson, Litchfield; Brian Jobson, Wolcott; Gary B. Larson, Cheshire, all of Conn.

[73] Assignee: MacDermid, Incorporated, Waterbury, Conn.

[21] Appl. No.: 6,142

[22] Filed: Jan. 19, 1993

Related U.S. Application Data

[63] Continuation of Ser. No. 908,944, Jul. 6, 1992, abandoned, which is a continuation of Ser. No. 710,665, Jun. 5, 1991, abandoned.

[51] Int. Cl.$^5$ .............................................. C25D 13/20
[52] U.S. Cl. ............................ 204/181.3; 204/181.6; 204/181.7; 205/188; 205/197
[58] Field of Search ............... 204/181.3, 181.6, 181.7; 205/188, 197

[56] References Cited

U.S. PATENT DOCUMENTS

| | | | |
|---|---|---|---|
| 2,364,993 | 12/1944 | Meyer | 148/6 |
| 2,460,896 | 2/1949 | Meyer | 148/6.14 |
| 2,460,898 | 2/1949 | Meyer | 148/6.14 |
| 2,481,854 | 9/1949 | MacMahon | 148/6.14 |
| 3,198,672 | 8/1965 | De Hart | 204/181.2 |
| 3,434,889 | 3/1969 | Haroldson et al. | 148/6.14 |
| 3,620,949 | 11/1971 | Morrison et al. | 204/181.3 |
| 3,677,828 | 7/1972 | Caule | 148/6.15 R |
| 3,892,646 | 7/1975 | Lazzarini et al. | 204/181 |
| 3,944,449 | 3/1976 | Caule | 148/258 |
| 4,091,125 | 5/1978 | Delgadillo | 427/409 |
| 4,144,118 | 3/1979 | Stahl | 156/659 |
| 4,409,037 | 10/1983 | Landau | 148/6.14 R |
| 4,592,816 | 6/1986 | Emmons et al. | 204/180.6 |
| 4,746,399 | 5/1988 | Demmer et al. | 156/656 |
| 4,751,172 | 6/1988 | Rodriguez et al. | 430/314 |
| 4,838,957 | 6/1989 | Miyamoto et al. | 148/260 |
| 4,844,981 | 7/1989 | Landau | 428/413 |
| 4,861,438 | 8/1989 | Banks et al. | 204/15 |
| 5,004,672 | 4/1991 | D'Ottavio et al. | 204/181.1 |

FOREIGN PATENT DOCUMENTS

| | | |
|---|---|---|
| 2-121388 | 6/1990 | Japan . |
| 3-057292 | 7/1991 | Japan . |
| 1194826 | 6/1970 | United Kingdom . |

Primary Examiner—John Niebling
Assistant Examiner—Kishor Mayekar
Attorney, Agent, or Firm—St. Onge Steward Johnston & Reens

[57] ABSTRACT

Copper surfaces upon which organic resins are electrophoretically deposited to serve as plating or etch resists in the course of manufacturing printed circuits, are preliminarily provided with a uniformizing/passivating coating layer, such as a layer of copper oxide or phosphate conversion coating, over which the organic resin is electrophoretically deposited, resulting in the organic resin being deposited with substantial uniformity in thickness and properties.

11 Claims, No Drawings

PROCESS FOR THE MANUFACTURE OF PRINTED CIRCUITS USING ELECTROPHORETICALLY DEPOSITED ORGANIC RESISTS

This is a continuation of copending application Ser. No. 07/908,944 filed on Jul. 6, 1992 abandoned, which in turn was a continuation of Ser. No. 07/710,665, filed Jun. 5, 1991, abandoned.

BACKGROUND OF THE INVENTION

The present invention relates to the manufacture of printed circuits and, more particularly, to improvement in those methods for manufacturing printed circuits which make use of electrophoretically deposited organic resists in the manufacturing sequence.

In the manufacture of printed circuits, it is well known to employ organic resists in the manufacturing sequence. For example, organic resists are often provided in a preselected pattern over a copper-covered dielectric substrate to serve as a selective plating resist, whereby a subsequent metallization step selectively further metallizes only those copper areas not covered by the resist material. Also well known is the provision of organic resists in a preselected pattern over a copper-covered dielectric substrate to serve as a selective etch resist, where a subsequent metal etching step selectively etches away only those copper areas not covered by the resist material.

The desired pattern of organic resist can be achieved by selective application of the resist composition to the copper surface through a suitably patterned mask or by photoimaging techniques. In the latter, the photoactive resist composition is applied as a layer to the copper surface and is then imagewise exposed to activating radiation of appropriate wavelength through a mask. Depending upon the nature of the photoactive composition, i.e., whether it is positive-working or negative-working, subsequent development of the composition will result in the leaving behind on the copper surface of a pattern of organic resist corresponding to the negative or positive, as the case may be, of the light-exposure pattern.

It is also known to employ as organic resists compositions which can be electrophoretically deposited over conductive (i.e., copper) surfaces. These resist compositions can be photoactive or non-photoactive. For the former, electrophoretic deposition is used to provide a layer of the composition to the copper surface, following which imagewise exposure and development result in the desired organic resist pattern. For the latter, the surface in question is already present in a pattern of conductive and non-conductive surfaces (such as is the case when a copper surface has been previously selectively patterned with a plating resist which remains temporarily in place), and the electrophoretic deposition of resist results in its selective application only to exposed conductive surfaces.

The prior art relating to electrophoretically depositable organic coatings is extensive. Electrophoretically deposited organic coatings have long been used by the automotive industry to mask selected metal areas during painting of metal panels and the like. Among the earliest references to the use of electrophoretically deposited organic coatings in the printed circuit field is USSR Inventor's Certificate No. 293,312, published May 10, 1971, wherein electrophoretically applied organic compositions are employed as etch resists in the manufacture of a printed circuit. As therein described, a first plating resist pattern is provided on a through-hole-containing copper foil covered substrate, followed by metallization of the through-holes and other copper areas not protected by the plating resist. By means of electrophoretic deposition, an organic resist is then selectively applied over the exposed copper areas to there serve as an etch resist. The plating resist is then removed, the copper thereunder etched down to the substrate surface, and the etch resist then removed to provide the desired pattern of copper circuitry.

Additional patents directed to the use of electrophoretically deposited organic resists in the manufacture of printed circuits include British Patent 1,194,826, published Jun. 10, 1970 (use as a mask for the selective electroplating or etching of metallic surfaces); French Patent Application 2,422,732 (use as a mask in the selective gold plating of electrical contacts); U.S. Pat. No. 3,892,646 to Lazzarini et al (electrophoretic deposition of polymer coating to selected portions of electrical connector contacts to serve as electrical insulation areas in final assembly); U.S. Pat. No. 4,592,816 to Emmons et al (photosensitive polymer compositions depositable by electrophoresis for use as resists in printed circuit manufacture); U.S. Pat. No. 4,746,399 to Demmer et al (use of uncured electrophoretically deposited resin as an etch resist over exposed copper areas of a copper surface patterned with a plating resist); U.S. Pat. No. 4,751,172 to Rodriguez et al (essentially as in the foregoing references, including using exposed and developed photosensitive electrophoretically deposited coating as plating resist and using differently soluble electrophoretically depositable coating as etch resist over copper areas not covered by plating resist); and U.S. Pat. No. 4,861,438 to Banks et al (use of particular electrophoretically deposited resin as resist in printed circuit manufacture).

The foregoing references, and particularly the extensive discussion in a number of them of various types of polymer resins which can be deposited by electrophoresis (e.g., cationic polymers depositable on the surface of a negatively charged substrate (cataphoresis) and anionic polymers deposited on the surface of a positively charged substrate (anaphoresis)), are incorporated herein by reference.

The use of electrophoretically depositable resins as resists in the manufacture of printed circuits provides a number of advantages to the manufacturer. By their nature, they are capable of selective deposition onto only the exposed conductive surfaces of a substrate already patterned in conductive and non-conductive surfaces, and thus provide the manufacturer with an easy means for selectively depositing resin to serve, e.g., as an etch resist for underlying copper areas in the manufacturing sequence. Even when the selective depositing property is not required, such as when the resin is a photoactive resin which will simply be deposited as a layer and subsequently exposed and developed in a pattern, electrophoretic deposition provides an easy means (in substitution for roller coating, curtain coating, etc.) for depositing the resin layer, and particularly for providing the resin as a very thin layer (e.g., 0.2 to 0.5 mil thickness) suitable when very fine line circuitry traces are desired.

Notwithstanding the potential advantages of electrophoretically depositing resists over copper surfaces in the course of printed circuit manufacture, a number of difficulties have been encountered in practice regarding the uniformity of the resist so applied and, as a consequence of such non-uniformity, the inability to obtain functionally satisfactory resists.

The present invention is based upon recognition of the problems and their causes in these regards, and is directed to improved methods for overcoming these deficiencies.

SUMMARY OF THE INVENTION

According to the present invention, it has been found that for all situations in the course of manufacture of a printed circuit wherein an organic resin is to be electrophoretically deposited on a copper surface to serve as a resist, significant advantage is realized if the copper surface is preliminarily provided with a uniformizing-/passivating coating, such as copper oxide, phosphate conversion coating, and the like, over which the organic resin is then electrophoretically deposited.

As noted, the inventive method is applicable to any or all of those situations in the course of printed circuit manufacture wherein an organic resin is to be deposited over a copper surface by electrophoresis to serve as a resist. While there are a vast number of different processes for manufacturing printed circuits using resists over copper surfaces, a few exemplary processes are discussed hereinafter as indicative of the breadth of the improved technique.

In the manufacture of printed circuit boards which do not contain metallized through-holes, as is generally the case for the manufacture of the innerlayer circuits for later use in fabrication of a multilayer printed circuit, the starting material is a dielectric substrate material having a coating of copper thereon (typically in the form of a copper foil cladding bonded to the dielectric substrate surface). The desired pattern of conductive circuitry is arrived at through use of photoimaging and etching techniques. In the context of electrophoretic deposition, then, an electrophoretically depositable photoimageable organic resin composition is deposited as a layer over the copper surface by electrophoresis. The layer is then imaged and developed to provide a resist in the pattern of the desired circuitry. Thereafter, the board is subjected to a copper etching process, whereby all copper not protected by the etch resist is etched away down to the substrate surface. Upon removal of the etch resist, there remains copper in the desired pattern.

In the known processes of this type, the copper surfaces to which the photoresist layer is to be applied are preliminarily treated to remove contaminants therefrom prior to the electrophoretic deposition, such as by cleaning to remove organic contaminants, chemical microetching and/or mechanical scrubbing to remove inorganic contaminants such as oxides, and other like processes. It has been found that in these known electrophoresis processes, the layer of electrophoretically depositable photoresist so applied is often not uniform in thickness, sometimes even to the point of having pinhole defects therein. It is theorized that this non-uniformity results from the fact that the cleaned copper surface is thermodynamically highly unstable and thus undergoes rapid and non-uniform surface oxidation before the resist layer can be electrophoretically deposited thereover. As a result, the surface over which the resist layer is deposited is neither physically uniform nor uniform in its conductivity/resistivity, and the resist layer deposited thereover correspondingly is also not uniform in thickness and properties. In this particular situation, i.e., in which photosensitive electrophoretically deposited resin is used as an etch resist, there are at least two disadvantageous consequences of this resin layer non-uniformity. First, problems may be encountered in the time and/or conditions necessary to achieve the imagewise exposure and development required to provide the desired etch resist pattern. Second, as to the etch resist so produced, its non-uniformity can result in certain areas thereof affording insufficient protection to the copper areas thereunder during the copper etching step (particularly so if the non-uniformity involves or includes pinhole defects); undesired etching of copper areas can, of course, lead to opens, shorts and other defects.

In the method of the invention, and in the context of the foregoing manufacturing process, the copper surfaces to which the photoimageable resin layer is to be electrophoretically applied are provided with a uniformizing/passivating coating prior to electrophoretic depositing of organic resin thereover. This formation of the uniformizing and passivating coating or layer on the copper surface can be carried out in a controlled manner to provide a substantially uniform surface. Apart from passivating the copper surfaces so as to prevent any random non-uniform oxidation prior to the electrophoretic deposition of the resin, the uniformizing/passivating coating presents to the electrophoretically deposited resin a surface which is uniform both physically and in terms of its conductivity/resistivity, thus enabling the electrophoretically deposited resin to itself be deposited as a substantially uniform layer, with substantially no defects, thus avoiding the problems earlier discussed with non-uniform resin deposit. For certain embodiments of the invention, particularly where the uniformizing/passivating coating is copper oxide, yet another added benefit of proceeding in this manner is that even if for some reason the copper etching solution penetrates an area of the etch resist, the underlying copper oxide can itself serve to protect the copper thereunder, particularly if the etchant is an alkaline etchant. (See, e.g., U.S. Pat. No. 4,144,118 to Stahl).

Following the application of the resin layer by electrophoresis over the uniformizing and passivating layer on the copper surfaces, and imaging and development, the copper areas not protected by the resist are then etched away down to the substrate surface. Depending upon the nature of the uniformizing/passivating coating, and the copper etchant employed, it may or may not be necessary to effect a first etching of the exposed uniformizing/passivating coating followed by etching of the metallic copper thereunder. Thus, for example, if the uniformizing/passivating coating is copper oxide, use of an acidic copper etchant (e.g., cupric chloride etchant solutions) will effect removal of both the copper oxide and the copper. If, however, the copper etchant is alkaline, such as an ammonia-based copper etchant, a first treatment with an acidic solution (e.g., mineral acid) will be needed to remove the copper oxide before etching away the underlying copper.

In view of the foregoing, it will readily be appreciated that the method of the present invention, i.e., the provision of a uniformizing and passivating coating on copper surfaces over which a resist will be electrophoretically deposited, has applicability to any number of printed circuit manufacturing processes employing resists either as plating and/or etch resists, and whether or not the resist is one which is produced by photoimaging.

By way of further example in this regard, the invention also is applicable in processes for manufacturing printed circuits containing metallized through holes, such as for double-sided printed circuits; multilayer printed circuits; and innerlayer circuits for those multilayer printed circuits which are to have buried through holes. In a typical process of this type for a double-sided circuit or for an innerlayer having through holes, the non-copper-clad dielectric has through-holes drilled therein, and the through-holes are metallized by, e.g., electroless copper depositing. The electrolessly copper plated through-holes and board surfaces can be further built up in copper thickness by means of further electroless or, more typically, electrolytic copper depositing. To this end, the board is photoimaged to provide a pattern of plating resist thereon (i.e., in the negative of the desired circuitry areas) before the additional plating so as to avoid plating copper areas which will eventually be etched away. In the context of this invention, the resist so employed can, if desired, be a photo-imageable electrophoretically depositable resist which is applied as a layer over the electroless copper surfaces and then imagewise exposed and developed. By first providing on the electroless copper surfaces a uniformizing and passivating layer according to the invention, the resin layer is electrophoretically depositable as a layer of substantially uniform thickness and properties, with the attendant advantage of uniformity in the imaging and developing steps.

Irrespective of the resist employed as the plating resist (i.e., electrophoretically depositable; dry film; liquid photoresist), the areas under the resist are then required to be etched away without etching away the built up copper areas which will form the copper circuitry. To this end, electrophoretically depositable organic etch resists are ideally suited since they can be selectively applied to the built up copper areas, and not over the plating resist, much in the same way as is possible with the electroplated tin and/or lead etch resists conventionally employed in the art. Obviously for this purpose the electrophoretically depositable organic resist need not be photoimageable. In accordance with the invention, the built up copper areas are first provided with a uniformizing and passivating coating before the etch resist is electrophoretically applied thereover, in this way enabling deposition of a resist of uniform thickness and properties and substantially without any pin hole defects. The resist thus serves well to protect the built up copper from etching. Moreover, as previously discussed, for certain uniformizing/passivating coatings such as copper oxide, even if copper etchant somehow manages to penetrate the resist, the copper oxide layer can itself afford protection from etchant.

Following the eletrophoretic deposition of etch resist, the plating resist is removed and the copper thereunder etched away down to the substrate surface. Thereafter, the etch resist can be removed, leaving the desired surface pattern of built-up copper circuitry.

DETAILED DESCRIPTION OF THE INVENTION

The coating or layer provided on the copper surfaces before an electrophoretically depositable organic resin is applied thereover by electrophoresis, is termed herein a uniformizing/passivating coating or layer.

The uniformizing/passivating coating or layer must possess a number of functional properties in order to be effective in the fabrication of printed circuits according to the invention. One requirement is that the coating be of a type (and generally of a thickness) which passivates the underlying copper surface, i.e., substantially prevents oxidation of such surface. In this same regard, it is apparent that the coating itself must be resistant to oxidation in air, since otherwise it would be prone to development of the very non-uniformity (by random, non-uniform oxidation) sought to be eliminated in the surface over which the electrophoretically depositable resin is to be applied. Another way of stating these criteria is that the uniformizing/passivating coating result in a substantially thermodynamically stable surface onto which the organic resin can be electrophoretically applied.

Another requirement of the coating is that it result in the surface, over which the electrophoretically depositable resin is to be applied, being substantially uniform. The uniformity sought is both a physical uniformity (i.e., a substantially even surface) and a uniformity in the conductivity/resistivity of the surface over which the resin is electrophoretically applied. Due to the nature of the electrophoretic deposition process, conductive surfaces which are uneven and/or non-uniform in conductivity/resistivity are not only prone to deposition of the resin in an uneven manner and in non-uniform thickness, but also can result in the resin layer so deposited being compositionally and/or micro-structurally non-uniform. All these non-uniformities of the resin layer can in turn lead to differences between various areas of the resin in their response to imaging and development (for photoimageable resins), in the protection they afford to the underlying metal surfaces during subsequent processing (e.g., copper etching), and in other like respects.

Another requirement of the uniformizing/passivating coating is that it be compatible with the electrophoretically depositable resin, in the sense of not interfering with its electrophoretic deposition over the metal surfaces in question and not somehow deleteriously altering the resin composition. Yet another requirement, of course, is that the uniformizing/passivating coating be compatible with the overall printed circuit process requirements. By way of example, the coating must at the least be removable from the circuit when it is necessary to etch away metal down to the substrate surface as part of the circuitry forming process.

Stated with respect to the electrophoretically deposited resin, the uniformizing/passivating coating is simply one which enables the resin to be electrophoretically deposited as a layer which is substantially uniform in terms of its thickness, composition and micro-structure.

Generally speaking, the uniformizing/passivating coating preferably will be in the nature of a conversion coating on the copper surface, i.e., a coating which involves or incorporates copper ions dissolved from the copper metal surface. Most preferred in this regard are copper oxide coatings and phosphate conversion coatings, but other conversion coatings can be employed, such as chromates, oxalates, sulfides, and the like.

As regards copper oxide coatings as the uniformizing/passivating coating according to this invention, it will be appreciated by those in this art that the formation of a copper oxide layer on a copper surface is a well known technique, and has been used for many years in the manufacture of multilayer printed circuits as a means for promoting adhesion between the copper circuitry of innerlayer circuits and the resinous ("prepreg") layers which are interleaved to form a multilayer printed circuit composite. See, e.g., U.S. Pat. Nos. 4,409,037 and 4,844,981 to Landau, and the references cited therein, all incorporated herein by reference. In such techniques, the copper circuitry of the innerlayer circuits which remains after photoimaging, etching and removal of resist, is treated to form thereon a layer of copper oxide which serves as an adhesion promoter. In contrast, the method of the present invention in this regard provides a uniform layer of copper oxide on the copper surfaces (of innerlayers as well as other type circuits) prior to the deposition of resist thereon. Nevertheless, the techniques known for formation of copper oxide layers on copper surfaces in the art of adhesion promotion can be employed in like manner to provide the copper oxide layer required by this invention.

Thus, according to this embodiment of the invention, the copper surfaces over which an organic resist will be electrophoretically deposited, either as a layer for subsequent exposure/development in a pattern, or directly in a pattern per se, and irrespective of whether the copper surfaces are copper foil or electroless copper or electrolytic copper, are treated to form a substantially uniform layer of copper oxide thereon prior to resist deposition. The techniques for accomplishing this can be through oxidation of the copper surface with hydrogen peroxide (as disclosed in U.S. Pat. No. 3,434,889) or air at elevated temperature (as described in U.S. Pat. No. 3,677,828), but the preferred means is by treatment of the copper surfaces (by immersion or spray technique) with aqueous solutions of an alkali metal or alkaline earth metal chlorite and an alkali hydroxide, as described in the above-noted Landau patents and, e.g., U.S. Pat. Nos. 2,364,993; 2,460,896; 2,460,898; and 2,481,854. The solutions of the Landau patents are preferred in this regard, i.e., solutions wherein the chlorite is present at from about 100 g/l to saturation and the hydroxide is present at from about 5 to about 25 g/l but such solutions are only preferred and many other ratios or amounts can be employed to produce the required copper oxide surface, e.g., hydroxide levels from 5 to 75 g/l and chlorite levels from 30 g/l to saturation. The criterion in this embodiment of the invention is simply that a uniform copper oxide layer be produced on the copper surface, whether it be a black oxide, red oxide, brown oxide, bronze oxide, etc. as such terms are known in the decorative arts and innerlayer adhesion promotion arts.

Generally, the copper surfaces on which the oxide layer is to be formed are first cleaned to remove contaminants therefrom, such as organics, oxides and the like by means of cleaning solutions, copper micro-etchants (e.g., peroxide/sulfuric solutions) and, less preferably, mechanical scrubbing or abrasion, all as well known in the art. As soon as possible thereafter, and following water rinsing, the copper surfaces are then contacted (e.g., by immersion or spraying) with the oxide forming solution, typically at a temperature of from about 80° F. to 200° F., for the time required to produce a layer of copper oxide of the desired uniformity vis-a-vis its surface, thickness and conductivity/-resistivity such that an organic resist which is thereafter electrophoretically deposited thereover can in turn be deposited with substantial uniformity in thickness and properties. Advantageously, the copper oxide layer formed on the copper surfaces in question will have a thickness on the order of from about 0.05 mg/cm$^2$ to about 1.0 mg/cm$^2$, more preferably from about 0.1 mg/cm$^2$ to about 0.4 mg/cm$^2$.

As noted, the uniformizing/passivating coating provided on copper surfaces (be they copper foil, or electroless copper or electrolytic copper) prior to electrophoretic deposit of resist thereover can also be a phosphate conversion coating. Provision of a phosphate conversion coating on a metallic substrate surface, such as the copper surfaces involved in the present invention, is a well known process in the metal finishing art. The phosphate coatings are conversion coatings in that they are formed in place at the metal surface and incorporate metal ions dissolved from the metal surface.

Compositions and processes for providing phosphate conversion coatings are well known and are not elaborated upon in detail here. Typically, the process involves contact of the metallic (here, copper) surface with a phosphating composition by immersion or spraying technique, for times ranging from as low as 30 seconds to as much as 5 to 6 minutes or more, depending upon the thickness of the coating to be produced and the phosphating composition being employed. A typical contact time for providing a phosphate conversion coating of requisite thickness on copper for purposes of this invention will be on the order of from 1 to about 5 minutes. The composition temperature will generally be in the range of from 60° F. to 200° F., again depending upon the thickness of coating desired, the phosphating composition, and the desired contact time. Typical temperatures for use in the invention are from about 120° F. to about 160° F.

The phosphating compositions can be acidic or alkaline aqueous solutions containing phosphoric acid and/or metal phosphates and/or other sources of metals such as zinc, iron, sodium, ammonium ion, manganese, and the like, and typically will also contain various accelerators for speeding the conversion reaction, such as nitrites, nitrates, chlorates, peroxides, and the like. As noted, the art is well versed in the variety of compositions for providing phosphate conversion coatings. The sole criterion of importance in this embodiment of the invention is that the copper surfaces over which an electrophoretically depositable organic resin is to be deposited by electrophoresis be preliminarily provided with a stable phosphate conversion coating which protects against random non-uniform oxidation in air, and which presents to the deposited resin a surface which is physically uniform and uniform in its conductivity/-resistivity characteristics.

The copper surfaces contacted with the phosphating composition will typically be cleaned before such contact to remove contaminants from the surfaces, such as organics, oxides, and the like, by means of cleaning solutions, copper micro-etchants (e.g., peroxide/sulfuric solutions) and, less preferably, mechanical scrubbing or abrasion techniques. Thereafter, the copper surfaces should be rinsed and then contacted with the phosphating solution as soon as possible.

Apart from other types of conversion coatings which possess the properties required of a uniformizing/passivating coating according to the invention, it is also possible to use simple deposited coatings which also possess the required properties, such as immersion tin coatings or electroplated coatings of metals such as zinc, tin, nickel, and the like.

Following the formation of the uniformizing/passivating layer, the entire substrate typically will be rinsed with water before organic resist material is electrophoretically deposited on the applicable copper surfaces. While it is generally good practice to avoid long holding periods between formation of the uniformizing/passivating coating layer and the deposition of the resist, it is a distinct advantage of this invention that since the uniformizing/passivating coating layer serves to passivate the copper surfaces against further random oxide formation in air, and is itself stable in this regard, the operating window between the controlled formation of the uniformizing/passivating coating layer and the time when resist must be deposited is greatly increased.

The electrophoretic deposition of resist over the copper surfaces (having the uniformizing/passivating layer thereon) can be carried out with any suitable electrophoretically depositable organic resin and under any suitable depositing conditions known in the art. As already noted, depending upon the printed circuit manufacturing sequence, the electrophoretic deposition may be such as to deposit a layer of a photoactive resin (which is then imaged and developed to produce the desired resist pattern for use as a plating or etch resist) or to selectively and directly deposit resin (e.g., as an etch resist) over the conductive surfaces of a board having an existing pattern of conductive and non-conductive surfaces.

In general, the electrophoretic deposition is carried out in a cell containing a solution or emulsion of the organic resin, and most typically the copper surfaces, on which the layer of uniformizing/passivating coating has been formed, serve as the cathode in the cell (positively-charged organic resin). The temperature at which the electrophoretic deposition is carried out generally will be between about 70° F. to about 100° F., and the voltage typically will be in the range of from about 20 to about 300 volts. The electrophoretic deposition of the resin continues until the desired thickness of resin is obtained. Generally, the thickness will be on the order of from about 0.2 to about 2.0 mil depending upon the type of resist (e.g., plating or etch) and the type of circuitry involved, but any optimal and desired thickness can be employed.

As has already been noted, the technique of the present invention is applicable whenever an organic resin is to be deposited over a copper surface to serve as a resist in the course of manufacturing a printed circuit. The preliminary provision of a uniformizing/passivating coating layer over the copper surface enables the resin to itself be deposited as a layer uniform in thickness and properties. This has significant advantage in the functionality of the resist so deposited (e.g., uniform resistance to etch, substantial absence of pinhole defects) and, for photosensitive resins, provides advantage in exposure and development techniques.

The invention is further described and illustrated in the following Examples.

EXAMPLE I

A 6"×6" laminate having a reinforced epoxy resin core and clad with copper foil was processed as follows:

1. The foil surfaces were cleaned of organic impurities by soaking in a commercial cleanser [Metex T-103 at 75 g/l; MacDermid, Inc.] for 3 minutes at a temperature of about 140°-160° F., followed by water rinsing.

2. The foil surfaces were then microetched in a peroxide/sulfuric solution [MACuPREP ETCH G-5; MacDermid, Inc.] for 2 minutes at a temperature of about 80° F., (effecting removal of about 50 microinches of copper), followed by water rinsing.

3. The board was then immersed in a solution of sodium chlorite and sodium hydroxide [OMNIBOND 9249/9251; MacDermid, Inc.] for 3 minutes at a temperature of about 170° F., to provide on the copper foil surfaces a controlled, uniform layer of copper oxide having a thickness of about 0.3 mg/cm$^2$, followed by water rinsing.

4. A 0.4 mil layer of photosensitive organic resin [Electro-Image 1000; PPG Industries] was then cataphoretically deposited over the copper oxide surfaces using an approximately 200 volt charge for about 30 seconds. Following drying, the layer of resin was exposed imagewise to activating radiation and developed to produce an etch resistant pattern of the resin.

5. Those copper oxide coated copper surfaces not protected by the resist pattern were etched away down to the dielectric layer using a cupric chloride etchant, followed by stripping of the resist and rinsing and drying of the laminate.

The layer of photosensitive resin electrophoretically deposited in step 4 was found upon visual examination to be extremely smooth, and the exposure/development to form the resist pattern proceeded under standard conditions in the times anticipated for a layer of uniform thickness. The resist of the pattern was again smooth and visually free of pinhole defects, and following etching and resist removal, the underlying copper showed no evidence of undesired etching (absence of irregularities, absence of opens or shorts).

By contrast, similar processing of a laminate but without the provision of a uniform copper oxide layer as in step 3, produced a resin layer of non-uniform thickness, surface irregularities and pinhole defects, also present in the resist following exposure/development. After etching and resist removal, the underlying copper showed evidence of undesired etching resulting in unwanted opens or shorts in the circuitry.

EXAMPLE II

A laminate having a reinforced epoxy resin core and clad with copper foil is processed as follows:

1. The foil surfaces are cleaned of organic impurities by soaking in a commercial cleanser [Metex T-103; MacDermid, Inc.] for 3 minutes at a temperature of about 140°-160° F., followed by water rinsing.

2. The foil surfaces are then microetched in a peroxide/sulfuric solution [MACuPREP ETCH G-5; MacDermid, Inc.] for about 2 minutes at a temperature of about 80° F. (effecting removal of about 50 microinches of copper), followed by water rinsing.

3. The board is then immersed in a phosphoric acid-containing phosphating solution [Phosphotex 4511; MacDermid, Inc.] for about 3 minutes at a temperature of about 150° F., to provide on the copper foil surfaces a phosphate conversion coating, followed by water rinsing.

4. A 0.4 mil layer of photosensitive organic resin [Electro-Image 1000; PPG Industries] is then cataphoretically deposited over the phosphate conversion coating surfaces using an approximately 200 volt charge for about 30 seconds. Following drying, the layer of resin is exposed imagewise to activating radiation and developed to produce an etch resistant pattern of the resin.

5. Those phosphate-coated copper surfaces not protected by the resist pattern are etched away down to the dielectric layer using an ammoniacal etchant [ULTRA ETCH 50; MacDermid, Inc.], followed by stripping of the resist and rinsing and drying of the laminate.

Utilizing the foregoing sequence, a 6"×6" laminate was processed through the first two steps and then only half the laminate immersed in the phosphating solution of step three. Although immediate visual inspection of the board showed no visually discernible difference between the phosphated and non-phosphated halves, the non-treated half of the board began to show visual evidence of random, non-uniform oxidation after standing in air for a few minutes, while the treated half remained bright and pink. After one-half hour standing in air, the treated half remained bright and pink, while the untreated half had still further oxidized (blue-green color).

Using another 6"×6" laminate processed as above (i.e., only one-half of the laminate provided with a phosphate conversion coating), the entire laminate was then processed as in steps four and five. The portion of the electrophoretically applied resin over the treated half of the laminate was smooth and shiny and showed no evidence of pinhole defects, while the portion of the resin over the untreated half had visually apparent surface irregularities. After imaging, development and etching, the laminate half that was provided with a phosphate conversion coating over the copper before resist deposition showed no evidence of undesired etching, while the other half of the laminate evidenced etching defects in the circuitry.

The same generalized process sequence is employed for electrophoretically depositing a photoactive organic resin layer to serve as a plating resist (after exposure/development), such as for the manufacture of printed circuits (including innerlayers) containing through-holes. In similar manner, the process is used for electrophoretic deposition of an etch resist for circuits already containing a pattern of exposed copper and plating resist. For example, in a multilayer printed circuit, the cured multilayer composite (consisting of alternating circuitry innerlayers and resinous substrate layers and whose outer facing surfaces are copper foil clad) has through holes drilled therein which are then subjected to the typical desmearing and/or etchback, through-hole conditioning, and catalytic activation steps for electroless copper metallization of the through-hole surfaces (at the same time providing electroless copper over the copper foil cladding). A photoresist (e.g., dry film) is then used to pattern the surfaces in the negative of the eventually desired pattern of circuitry traces, pads, lands, etc., i.e., the resist serving as a plating resist. Additional copper (typically electrolytic) is then plated over the exposed copper areas (i.e., those not covered by the plating resist). Following this plating, the built up copper surfaces are treated to provide thereon the uniformizing/passivating layer according to the invention, and an etch resistant resin is then electrophoretically applied thereover (the deposition being selective to the conductive coated copper surfaces by virtue of the electrophoretic process and nature of the resin resist). The plating resist is then selectively removed (being strippable in a medium which does not strip the electrophoretically deposited etch resist), and the copper (and its uniformizing/passivating coating) thereunder etched away down to the substrate surface. The etch resist is then removed, thus leaving behind the desired circuitry pattern, and the board is then further processed (with optional first removal of uniformizing-/passivating coating) to solder mask certain areas and provide solder on others.

In a process of the foregoing type, it will be understood and appreciated by those of skill in the art that the choices made for the various resist materials will be dictated by functional considerations relating to the particular process sequence. For example, as already noted, the resist serving as a plating resist in a process of the foregoing type will be chosen so that it is strippable in a medium which does not at the same time strip the electrophoretically deposited etch resist. So too, in a process of the foregoing type wherein a uniformizing-/passivating coating layer is provided on built up copper surfaces before the etch resist is electrophoretically deposited thereover, but while the plating resist is still in place, the plating resist will be chosen such that it will not dissolve or be stripped during the formation of the uniformizing passivating coating later. For example, where the uniformizing/passivating coating layer is produced using highly alkaline media (such as in the formation of a copper oxide layer using the preferred alkali metal chlorite/alkali metal hydroxide solutions), the alkalinity thereof will then generally dictate that the plating resist (be it generated from a dry film photoresist or other suitable method) not be soluble/strippable in aqueous alkaline media, but instead be a solvent-strippable or acid-strippable resist.

It should be noted here that it is not uncommon in the printed circuit fabrication art for copper surfaces to be provided with protective coatings in between various processing steps. For example, the single-sided or double-sided copper foil clad dielectric substrates which are often used as the starting material for forming circuitry innerlayers or outerlayers, are often received from the manufacturer with an anti-tarnish coating thereon. As a general rule, this anti-tarnish coating is organic in nature (and thus is not within the scope of uniformizing-/passivating coating layers according to the present invention). Moreover, such anti-tarnish coatings, whatever their nature, are not intended to, and rarely do, afford complete protection against oxidation of the copper surface in air, and still further are neither intended nor required to (nor do) possess any substantial degree of uniformity in thickness and/or conductivity/-resistivity. In the practice of this invention, such coatings are not effective as uniformizing/passivating coating layers and organic resin cannot be electrophoretically deposited thereover to yield the desired thickness and property uniformity in the deposited resin. Indeed, in practice of the invention, coatings of this type are among the contaminants removed from the copper foil surface before provision thereon of the uniformizing-/passivating coating layer.

The same is true for anti-tarnish-like coatings which are sometimes applied to copper surfaces in the course of printed circuit fabrication to afford at least some degree of tarnish protection as the circuit stands in air awaiting a next processing step (e.g., between the time of electroless copper deposition in a plating line and transport of the circuit to a remote location where resist photoimaging might take place). Coatings of this type similarly cannot function as uniformizing/passivating coating layers according to the invention herein for the reasons already noted.

It will be appreciated that the foregoing is provided in description and illustration of the invention and preferred embodiments thereof, and that numerous other variations and modifications are contemplated within the scope and spirit of the invention, as defined by the appended claims.

What is claimed is:

1. In a process for manufacturing a printed circuit, wherein an organic resin is electrophoretically deposited over a copper surface to serve as a resist in the process and is at least in part subsequently removed from said copper surface, the improvement comprising providing said copper surface with a layer of a phosphate conversion coating and thereafter electrophoretically depositing said organic resin over said layer of phosphate conversion coating.

2. A process according to claim 1 wherein said organic resin is photoactive, and wherein, after said organic resin is electrophoretically deposited over said layer of phosphate conversion coating, said resin is imagewise exposed and developed to provide a desired pattern of resist.

3. A process according to claim 2 wherein said resist serves as a plating resist.

4. A process according to claim 2 wherein said resist serves as an etch resist.

5. A process according to claim 1 wherein said organic resin is directly electrophoretically deposited in a pattern to serve as an etch resist.

6. A process according to claim 1 wherein said copper surface upon which is formed said layer of phosphate conversion coating over which said organic resist in electrophoretically deposited is a copper foil affixed to an insulating substrate surface.

7. A process according to claim 1 wherein said copper surface upon which is formed said layer of phosphate conversion coating over which said organic resin is electrophoretically deposited is the surface of a layer of electroless copper.

8. A process according to claim 1 wherein said copper surface upon which is formed said layer of phosphate conversion coating over which said organic resin is electrophoretically deposited is the surface of a layer of electrolytic copper.

9. In a process for manufacturing a patterned circuitry innerlayer for a multilayer printed circuit, wherein a copper-clad insulating substrate is provided with a layer of photoactive organic resin by electrophoretic deposition; followed by imagewise exposure of said layer of photoactive resin to activating radiation, and development of said image, to produce from said resin an etch resist in the pattern of the desired circuitry; followed by etching away of said copper, down to the insulating substrate surface, at areas not protected by said etch resist; followed by removal of said etch resist to reveal an underlying pattern of copper circuitry; the improvement comprising providing on said copper cladding, prior to the provision thereon of said layer of photoactive organic resin, a layer of a phosphate conversion coating, and thereafter electrophoretically depositing said layer of photoactive organic resin over said layer of phosphate conversion coating.

10. In a process for manufacturing a printed circuit wherein a copper-clad insulating substrate has through-holes drilled therein; followed by metallization of said through-holes, and coating said copper cladding with electroless copper; followed by application to the electrolessly copper coated copper cladding of a layer of photoresist which is imaged and developed to form a plating resist over selected areas of said electrolessly copper coated copper cladding corresponding to a negative of a pattern of eventually desired circuitry; followed by provision of additional copper over the electrolessly copper coated copper cladding not covered by said plating resist and over the electrolessly copper coated throughholes; followed by electrophoretic deposition of an organic etch resist over said additional copper, which is over said electrolessly copper-coated copper cladding; followed by removal of said plating resist and etching away the copper thereunder; and followed by removal of said organic etch resist; the improvement comprising providing said additional copper, which is over said electrolessly copper-coated copper cladding, with a layer of phosphate conversion coating before the electrophoretic deposition of said organic etch resist thereover, and thereafter electrophoretically depositing said organic etch resist over said layer of phosphate conversion coating.

11. A process according to claim 10 wherein said additional copper is a layer of electrolytic copper.

* * * * *